(12) United States Patent
Macraild et al.

(10) Patent No.: US 6,684,766 B1
(45) Date of Patent: Feb. 3, 2004

(54) WIPER BLADES FOR SCREEN PRINTING

(75) Inventors: Neil MacMillan Macraild, Weymouth (GB); Simon Garry Clasper, Weymouth (GB)

(73) Assignee: Dek International GmbH, Zurich (CH)

( * ) Notice: Subject to any disclaimer, the term of this patent is extended or adjusted under 35 U.S.C. 154(b) by 88 days.

(21) Appl. No.: 10/018,532

(22) PCT Filed: Jun. 22, 2000

(86) PCT No.: PCT/GB00/02405
§ 371 (c)(1),
(2), (4) Date: Dec. 20, 2001

(87) PCT Pub. No.: WO00/78549
PCT Pub. Date: Dec. 28, 2000

(30) Foreign Application Priority Data

Jun. 22, 1999 (GB) .............................. 9914580

(51) Int. Cl.[7] .............................. B41F 15/44
(52) U.S. Cl. ........................ 101/123; 101/120
(58) Field of Search ................. 101/120, 123, 101/124, 155, 157, 169, 425; 15/256.5, 256.51, 256.53; 118/413

(56) References Cited

U.S. PATENT DOCUMENTS

| | | | | |
|---|---|---|---|---|
| 2,445,140 A | * | 7/1948 | Hanington | 101/114 |
| 3,884,145 A | * | 5/1975 | Datwyler | 101/169 |
| 4,753,163 A | | 6/1988 | Blaak | |
| 4,823,161 A | * | 4/1989 | Yamada et al. | 399/350 |
| 5,001,979 A | | 3/1991 | Kürten | |
| 5,078,061 A | * | 1/1992 | Messerschmitt | 101/123 |
| 5,715,748 A | * | 2/1998 | Murakami et al. | 101/114 |
| 5,775,219 A | | 7/1998 | Shimazu et al. | |

FOREIGN PATENT DOCUMENTS

| | | |
|---|---|---|
| EP | 0 167 906 | 1/1986 |
| GB | 2 334 479 A | 8/1999 |
| WO | WO98/16387 | 4/1998 |

* cited by examiner

*Primary Examiner*—Ren Yan
(74) *Attorney, Agent, or Firm*—Shanks & Herbert

(57) ABSTRACT

A wiper blade for a screen printing head in which pasty product to be screen printed is biased toward a printing screen under pressure, the wiper blade comprising an elongate blade element having a thickness of between 0.1 and 0.5 mm, one edge of the blade element being configured to be fixed to a screen printing head and the other edge of the blade element being a forwardly-directed free edge which in use contacts a printing screen, and a strip fixed to the upper, non-screen contacting surface of the blade element along the free edge there of, wherein the strip and the free edge of the blade element together define a leading face which has a height of from 1 to 2.5 mm and encloses an acute angle with the printing screen.

14 Claims, 3 Drawing Sheets

WIPER BLADES FOR SCREEN PRINTING

This application claims priority to International Patent Application PCT/GB00/02405 filed Jun. 22, 2000 and to United Kingdom patent application 9914580.7 filed Jun. 22, 1999.

FIELD OF THE INVENTION

The present invention relates to wiper blades for screen printing, and has particular, though not exclusive, application to screen printing apparatus of the kind disclosed in WO-98/16387 which applies a pasty product to a printing screen by applied pressure.

BACKGROUND OF THE INVENTION

WO-98/16387 discloses a screen printing apparatus for screen printing a pasty product onto a workpiece. As illustrated in FIG. 7, this screen printing apparatus comprises a printing head 100 which is moveable bi-directionally over a printing screen 101, as indicated by arrows A and B. The printing head 100 comprises a main body 102, first and second wiper blades 103, which contact the printing screen 101 and together with the main body 102 define a chamber 104 containing a pasty product 105, a grille 106 located at the lower end of the main body 102, and a piston 107 for applying a downward pressure on the pasty product 105. In use, the printing head 100 is moved in one of the two opposite printing directions which causes the wiper blades 103, which are pressed against the printing screen 101 by the force imparted on the pasty product 105 by the piston 107, to act to lift the pasty product 105 from the region above the printing screen 101, as illustrated by the curved arrows, causing the pasty product 105 to pass upwardly through the grille 106, which pasty product is subsequently forced back downwardly through the grille 106 by the action of the pressure developed by the piston 107. This working of the pasty product 105 confers the pasty product 105 with rheological qualities suitable for its application, and is particularly important when the pasty product 105 is a mixture of particles of different densities, such as for example solder paste which comprises balls of metal in a flux paste.

It is important to restrict the thickness of the wiper blades so as not to be unduly stiff and allow the same to be pressed downwardly by the pressure applied to the pasty product such that the free edges of the wiper blades can conform to the surface of the printing screen so as to ensure good shearing of the pasty material over the stencil apertures and good gasketting of the printing screen to an underlying workpiece being screen printed, thereby to prevent pasty product bleeding out and giving a smeared print.

It is also important that the wiper blades can conform to sealing members provided at the ends of the main body to prevent any leakage of pasty product onto the stencil.

SUMMARY OF THE INVENTION

Accordingly, the present invention provides a wiper blade for a screen printing head in which pasty product to be screen printed is biased towards a printing screen under pressure, the wiper blade comprising an elongate blade element having a thickness of between 0.1 and 0.5 mm, one edge of the blade element being configured to be fixed to a screen printing head and the other edge of the blade element being a forwardly-directed free edge which in use contacts a printing screen, and a strip fixed to the upper, non-screen contacting surface of the blade element along the free edge thereof, wherein the strip and the free edge of the blade element together define a leading face which has a height of from 1 to 2.5 mm and encloses an acute angle with the printing screen.

Preferably, the blade element comprises a generally rectangular strip of sheet material.

More preferably, the sheet material is a stainless steel sheet material.

Preferably, the strip is formed of a flexible material.

Preferably, the strip is formed of a plastics material.

More preferably, the plastics material is a polyester material, still more preferably Mylar (RTM).

Preferably, the blade element has a thickness of about 0.25 mm and the leading face of the wiper blade has a height of about 1.6 mm.

Preferably, the leading edge of the strip at the free edge of the blade element is inclined upwardly and forwardly so as to meet the surface of the blade element at an acute angle.

Preferably, the trailing edge of the strip is inclined downwardly and rearwardly so as to meet the surface of the blade element at an obtuse angle.

Preferably, the strip extends the full length of the blade element except for the distal end regions.

The present invention also provides a screen printing head for applying a pasty product to a printing screen, comprising a main body and first and second wiper blades, wherein the wiper blades are inwardly and downwardly directed and at least one of the first and second wiper blades has the construction of the above-described wiper blade.

Preferably, the first and second wiper blades have the construction of the above-described wiper blades.

By means of the invention, a wiper blade formed from a thin flexible sheet, preferably of stainless steel, can, without significantly reducing the flexibility at the free edge of the wiper blade, be given a side face to the leading edge which is highly effective in ensuring complete filling with pasty product of apertures in the printing screen while maintaining effective shearing of pasty product at the upper face of the printing screen, thus avoiding wedging, dog-earring and rippling at the upper surface of the product in the apertures in the printing screen, while enhancing the working of the product immediately above the printing screen in front of the side face of the leading edge of the wiper blade to improve the rheological condition of the pasty product.

BRIEF DESCRIPTION OF THE DRAWINGS

Preferred embodiments of the present invention will now be described hereinbelow by way of example only with reference to the accompanying drawings, in which.

DETAILED DESCRIPTION OF THE PREFERRED EMBODIMENTS

Figure 1:
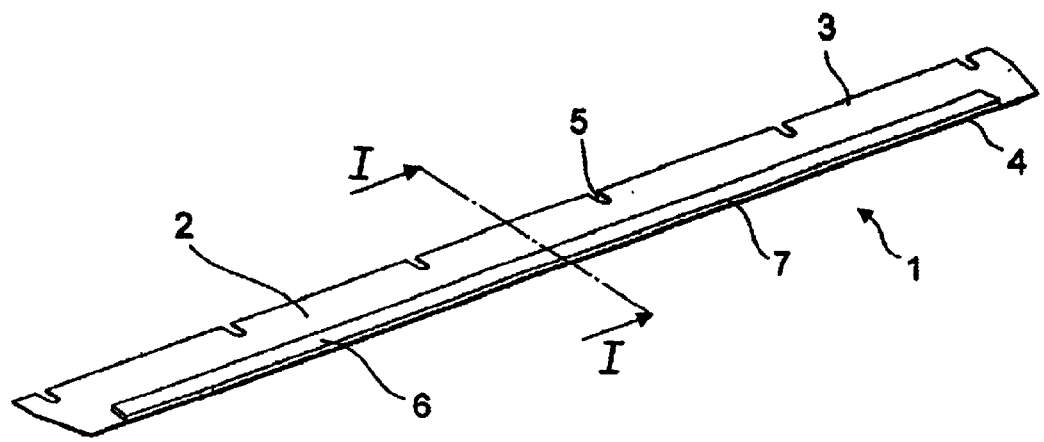
FIG. 1 illustrates a perspective view of a wiper blade in accordance with a first embodiment of the present invention.
Figure 2:
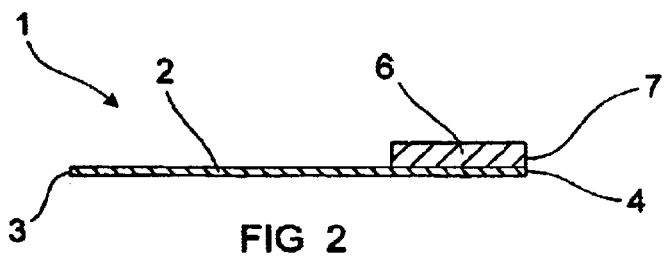
FIG. 2 illustrates a sectional view (along Section I—I) of the wiper blade of FIG. 1.

FIGS. 1 and 2 illustrate a wiper blade 1 in accordance with a first embodiment of the present invention for use in a screen printing head.

The wiper blade 1 comprises a thin, flexible elongate blade element 2 which includes first and second longitudinal edges 3, 4, one edge 3 including slots 5 by means of which the wiper blade 1 can be anchored to a screen printing head and the other edge 4 being a free edge which in use contacts a printing screen, and a strip 6 of greater thickness than the blade element 2 fixed, in this embodiment by bonding, to the upper surface of the blade element 2 along the free edge 4 thereof. In this embodiment the blade element 2 is formed of a stainless steel sheet having a thickness of about 0.25 mm and the strip 6 is formed of a polyester material, preferably Mylar (RTM), having a thickness of about 1.5 mm and width of about 6 mm. The strip 6 extends along the full length of the blade element 2 except for the distal end regions thereof which are required to be in tight sealing engagement with the end caps of the screen printing head. With this construction, the wiper blade 1, which in use is directed forwardly and encloses an acute angle with the printing screen during a printing operation, presents a broad face 7, in this embodiment of about 1 to 2.5 mm, preferably about 1.6 mm, in height at the free edge 4 of the blade element 2.

Figure 3:
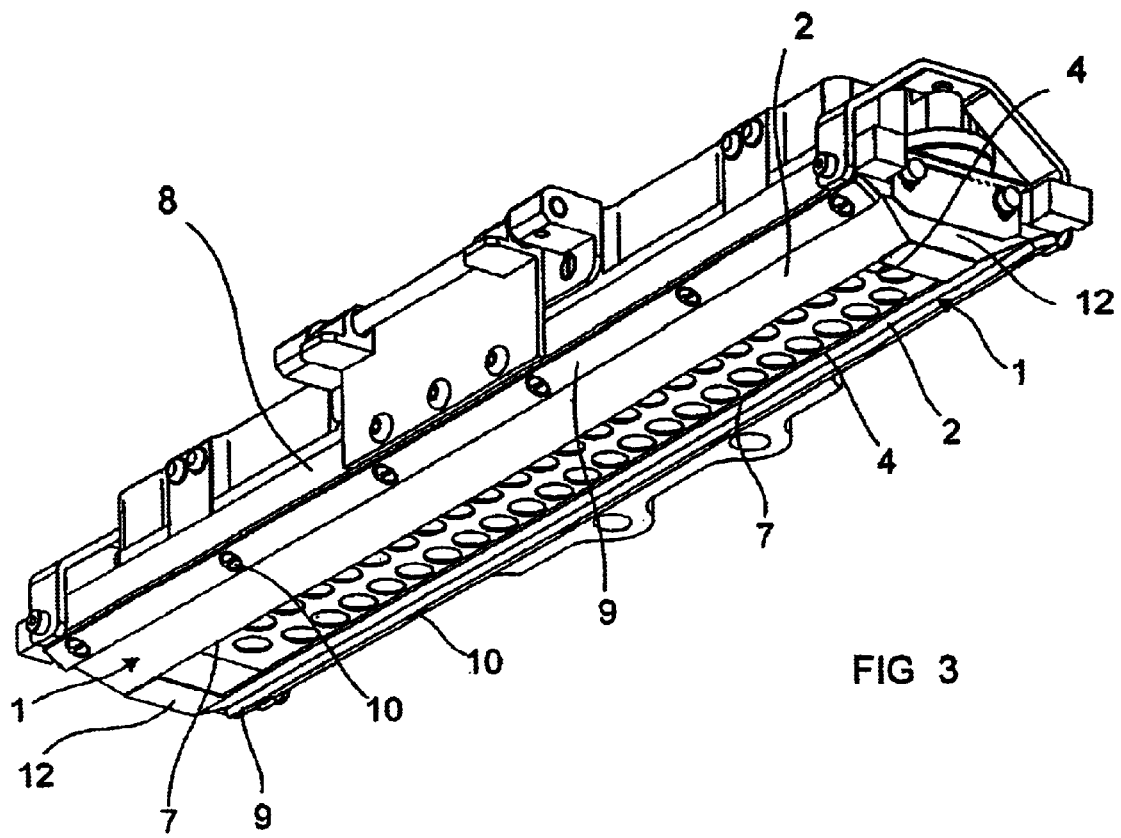
FIG. 3 illustrates a perspective view of a screen printing head in accordance with a preferred embodiment of the present invention.
Figure 4:
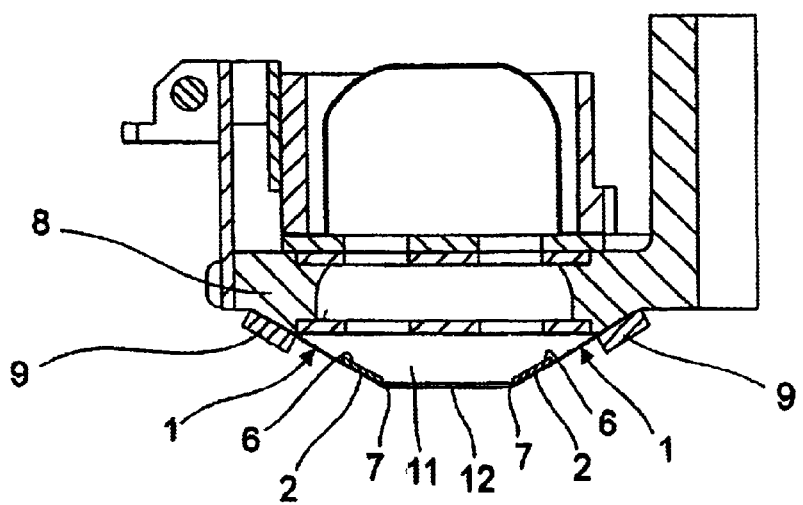
FIG. 4 illustrates a sectional view of the screen printing head of FIG. 3.
Figure 7:
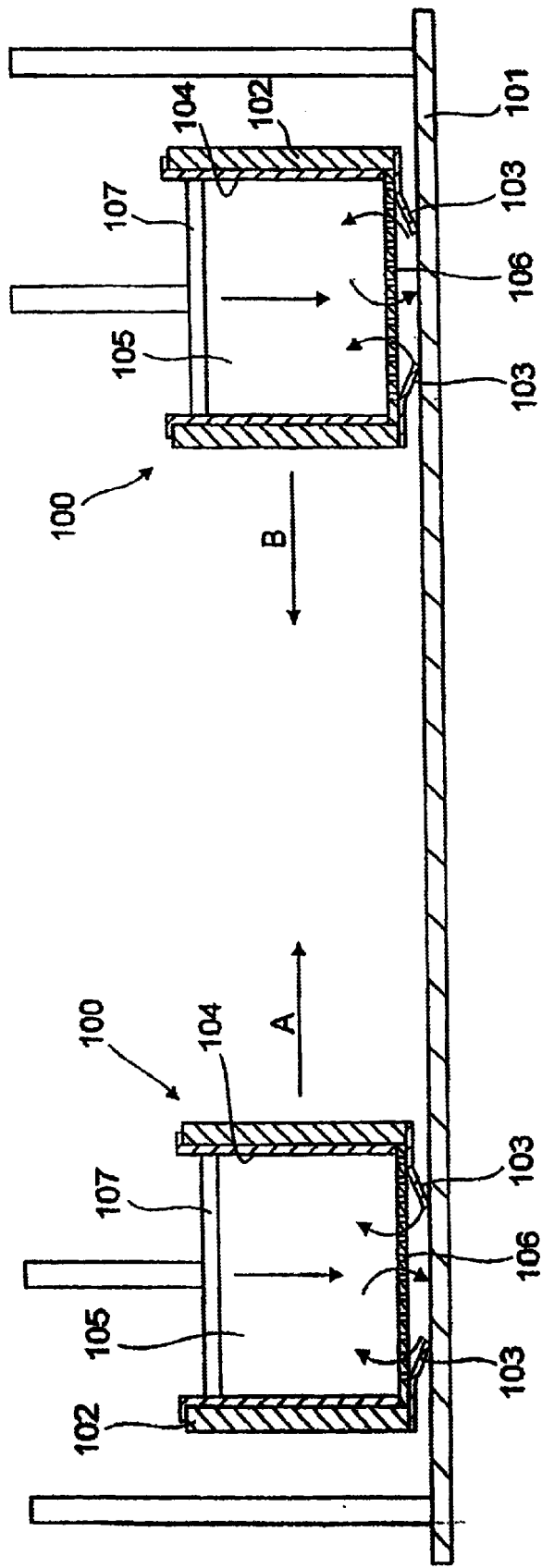
FIG. 7 illustrates a schematic sectional view detailing the operation of a known screen printing head.

FIGS. 3 and 4 illustrate a screen printing head in accordance with a preferred embodiment of the present invention.

The printing head comprises a main body 8, and first and second wiper blades 1 clamped thereto by respective clamping plates 9 and screws 10, the screws 10 passing through the slots 5 in the blade elements 2. The wiper blades 1 are inwardly and downwardly directed and together with the main body 8 define a chamber 11 which in use contains a pasty material. The main body 8 includes sealing members 12 at each of the ends thereof, which sealing members 12 are formed of a flexible material so as to conform to the blade elements 2 which deflect during printing.

Figure 5:
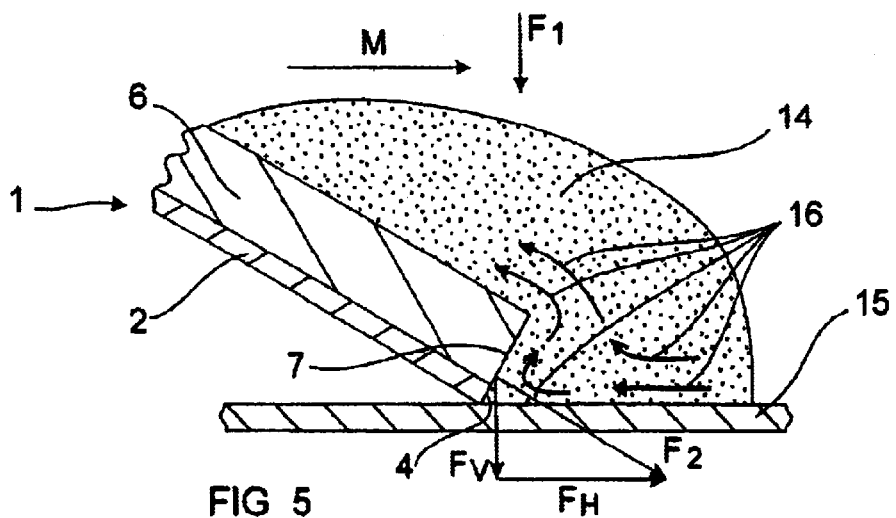
FIG. 5 illustrates a sectional view of a free edge portion of the wiper blade of FIG. 1 in contact with a printing screen.

In use, the printing head is first filled with a pasty material 14 and pressed down into contact with a printing screen 15 by a loading force $F_1$. FIG. 5 illustrates an enlarged view of the interrelationship of the forwardly-directed, trailing wiper blade 1 and the printing screen 15. As can be seen, the broad leading face 7 of the wiper blade 1 encloses an acute angle with the surface of the printing screen 15. The printing head is then moved over the printing screen 15 in the printing direction (as indicated by arrow M), during which movement a force $F_2$ is applied to the pasty material 14 by the action of the broad leading face 7 of the wiper blade 1, which force $F_2$ is perpendicular to the leading face 7 of the wiper blade 1 and can be resolved into vertical and horizontal components $F_V$ and $F_H$. The vertical force component $F_V$ is supplemental to the loading force $F_1$ applied generally to the pasty material 14 by the printing head, and is such as to advantageously provide a locally increased downward force on the pasty material 14 ahead of the leading face 7 of the wiper blade 1. Also, during movement of the printing head in printing, the tendency of the pasty material 14 to adhere to the printing stencil 15 is such that a disturbed flow of the pasty material 14 is created ahead of the leading face 7 of the wiper blade 1, as indicated by arrows 16 in FIG. 5. This local disturbance in the flow of the pasty material 14 caused by the broad leading face 7 of the wiper blade 1 provides for additional local working of the pasty material 14, which by virtue of the thixotropic nature of the pasty material 14 causes the pasty material 14 to become locally more fluid. The combined effect of the locally increased force and greater fluidity improves the packing of the pasty material 14 into the apertures in the printing screen 15 and also the contact between the pasty material 14 and the underlying workpiece on which the pasty material 14 is being applied. This improved packing and workpiece contact prevents the pasty material 14 from being dragged out of the apertures in the printing screen 15 as is observed when using conventional wiper blades.

Figure 6:
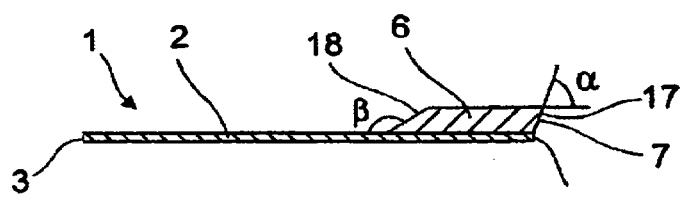
FIG. 6 illustrates a sectional view (along section I—I) of a wiper blade in accordance with a second embodiment of the present invention.

FIG. 6 illustrates a cross-sectional view of a wiper blade 1 in accordance with a second embodiment of the present invention. The wiper blade 1 of this embodiment is of similar construction to the wiper blade 1 of the above-described first embodiment and differs only in the configuration of the strip 6. In this embodiment the longitudinal edges 17, 18 of the strip 6 are inclined. The forward longitudinal edge 17, defining in the main part the leading face 7 of the wiper blade 1, is inclined such as to enclose an acute angle a with the lower surface of the blade element 2. With a decreasing angle $\alpha$, the angle between the leading face 7 of the wiper blade 1 and the surface of the printing screen 15 decreases and the vertical component $F_V$ of the force applied during printing to the pasty material 14 by the leading face 7 of the wiper blade 1 increases. The rearward longitudinal edge 18 is inclined such as to enclose an obtuse angle $\beta$ with the upper surface of the blade element 2. By sloping the rearward longitudinal edge 18 of the strip 6, the possibility of pasty material 14 being trapped in the rearward junction of the blade element 2 and the strip 6 is much reduced.

Although in the above-described embodiments the blade element 2 is formed from stainless steel strip and the strip 6 is formed from a polyester strip bonded to the blade element 2, many other combinations of materials are possible. For example, both the blade element 2 and the strip 6 could be formed from a polyester material with the incorporation of a wear strip as detailed in our GB-A-2334479.

Further, although the specific dimensions detailed above are typical for a wiper blade for use in a screen printing head, configured specifically for the DEK ProFlow Print Head, these dimensions can be altered as necessary to suit the screen printing head.

Finally, it will be understood that the present invention has been described in its preferred embodiments and can be modified in many different ways without departing from the scope of the invention as defined by the appended claims.

What is claimed is:

1. A wiper blade for a screen printing head in which pasty product to be screen printed is biased towards a printing screen under pressure, the wiper blade comprising an elongate blade element having a thickness of between 0.1 and 0.5 mm, one edge of the blade element being configured to be fixed to a screen printing head and the other edge of the blade element being a forwardly-directed free edge which in use contacts a printing screen, and a strip fixed to the upper, non-screen contacting surface of the blade element along the free edge thereof, wherein the strip and the free edge of the blade element together define a leading face which has a height of from 1 to 2.5 mm and encloses an acute angle with the printing screen.

2. The wiper blade of claim 1, wherein the blade element comprises a generally rectangular strip of sheet material.

3. The wiper blade of claim 2, wherein the sheet material is a stainless steel sheet material.

4. The wiper blade of claim 3, wherein the strip is formed of a plastics material.

5. The wiper blade of claim 4, wherein the strip is formed of a polyester material.

6. The wiper blade of claim 1, wherein the strip is formed of a flexible material.

7. The wiper blade of claim 6, wherein the strip is formed of a plastics material.

8. The wiper blade of claim 7, wherein the plastics material is a polyester material.

9. The wiper blade of claim 1, wherein the blade element has a thickness of about 0.25 mm and the leading face of the wiper blade has a height of about 1.6 mm.

10. The wiper blade of claim 1, wherein the leading edge of the strip at the free edge of the blade element is inclined upwardly and forwardly so as to meet the surface of the blade element at an acute angle.

11. The wiper blade of claim 1, wherein the trailing edge of the strip is inclined downwardly and rearwardly so as to meet the surface of the blade element at an obtuse angle.

12. The wiper blade of claim 1, wherein the strip extends the full length of the blade element except for the distal end regions.

13. A screen printing head for applying a pasty product to a printing screen, comprising a main body and first and second wiper blades, wherein the first and second wiper blades are inwardly and downwardly directed and at least one of the first and second wiper blades is the wiper blade of claim 1.

14. The screen printing head of claim 13, wherein the first and second wiper blades are the wiper blades of claim 1.

* * * * *